United States Patent
Raghavan et al.

(10) Patent No.: US 8,664,076 B2
(45) Date of Patent: Mar. 4, 2014

(54) METHOD OF FORMING A ROBUST, MODULAR MIS (METAL-INSULATOR-SEMICONDUCTOR) CAPACITOR WITH IMPROVED CAPACITANCE DENSITY

(75) Inventors: Venkat Raghavan, Union City, CA (US); Andrew Strachan, Santa Clara, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/239,192

(22) Filed: Sep. 21, 2011

(65) Prior Publication Data

US 2013/0069200 A1 Mar. 21, 2013

(51) Int. Cl.
*H01L 21/20* (2006.01)

(52) U.S. Cl.
USPC ............ 438/393; 438/394; 438/398; 438/399

(58) Field of Classification Search
USPC .......... 438/381, 393, 396, 398; 257/303, 306, 257/516, 532, 535, E21.008, E21.35, 257/E21.351, E21.396, E29.393, E29.345
See application file for complete search history.

(56) References Cited

U.S. PATENT DOCUMENTS

| | | | | |
|---|---|---|---|---|
| 4,384,299 A * | 5/1983 | Raffel et al. | | 257/324 |
| 4,645,564 A * | 2/1987 | Morie et al. | | 438/388 |
| 5,005,102 A * | 4/1991 | Larson | | 361/313 |
| 5,151,768 A * | 9/1992 | Aso | | 257/524 |
| 5,245,505 A * | 9/1993 | Shiga et al. | | 361/311 |
| 6,150,258 A * | 11/2000 | Mountsier et al. | | 438/623 |
| 6,204,144 B1 * | 3/2001 | Hsu | | 438/396 |
| 6,459,562 B1 * | 10/2002 | KarRoy et al. | | 361/312 |
| 6,646,323 B2 * | 11/2003 | Dirnecker et al. | | 257/532 |
| 6,765,256 B2 * | 7/2004 | Takeuchi et al. | | 257/306 |
| 6,831,315 B2 * | 12/2004 | Raaijmakers et al. | | 257/296 |
| 7,329,939 B2 * | 2/2008 | Hsu et al. | | 257/532 |
| 7,510,944 B1 * | 3/2009 | Raghavan et al. | | 438/381 |
| 7,682,925 B2 * | 3/2010 | Kim | | 438/396 |
| 2001/0007797 A1 * | 7/2001 | Jang et al. | | 438/761 |
| 2002/0028541 A1 * | 3/2002 | Lee et al. | | 438/149 |
| 2003/0139017 A1 * | 7/2003 | Park | | 438/396 |
| 2004/0126983 A1 * | 7/2004 | Kim | | 438/396 |
| 2005/0063140 A1 * | 3/2005 | Hackler et al. | | 361/312 |
| 2006/0163640 A1 * | 7/2006 | Park et al. | | 257/306 |
| 2007/0148899 A1 * | 6/2007 | Kim | | 438/396 |

FOREIGN PATENT DOCUMENTS

JP 61198660 A * 9/1986

* cited by examiner

*Primary Examiner* — Ori Nadav
*Assistant Examiner* — Ernest Allen, III
(74) *Attorney, Agent, or Firm* — Eugene C. Conser; Wade J. Brady, III; Frederick J. Telecky, Jr.

(57) ABSTRACT

A method of forming a capacitor structure comprises: forming a doped polysilicon layer on an underlying dielectric layer; forming a dielectric stack on the doped polysilicon layer; forming a contact hole in the dielectric stack to expose a surface region of the doped polysilicon layer; forming a conductive contact plug that fills the contact hole and is in contact with the exposed surface of the doped polysilicon layer; forming a plurality of trenches in the dielectric stack such that each trench exposes a corresponding surface region of the doped polysilicon layer; forming a conductive bottom capacitor plate on exposed surfaces of the of the dielectric stack and on exposed surfaces of the doped polysilicon layer; forming a capacitor dielectric layer on the bottom capacitor plate; and forming a conductive top capacitor plate on the capacitor dielectric layer.

4 Claims, 6 Drawing Sheets

US 8,664,076 B2

METHOD OF FORMING A ROBUST, MODULAR MIS (METAL-INSULATOR-SEMICONDUCTOR) CAPACITOR WITH IMPROVED CAPACITANCE DENSITY

FIELD OF THE INVENTION

The present invention relates generally to semiconductor integrated circuits (IC) and, in particular, to formation of a robust, modular metal-insulator-metal (MIM) capacitor that provides increased capacitance density without the use of a high K dielectric.

BACKGROUND OF THE INVENTION

Current IC capacitor designs utilize a two dimensional layout for the capacitor, which is an inefficient use of semiconductor real estate. The embodiments disclosed herein provide a method that forms the MIM capacitor in a three-dimensional format, thereby improving semiconductor real estate usage. For analog applications, typical capacitance would be in the range of 0.5 fF/sg.µm that is needed to support a breakdown voltage of 12V, thereby necessitating the need for a large area. Therefore, density improvement in capacitance will result in significant die size reduction.

Current capacitor designs use polysilicon as the bottom plate of the capacitor. With this approach, the breakdown distribution of the capacitor is significantly impacted by poly deposition, doping process and subsequent thermal anneals. In the disclosed embodiments, polysilicon is used only as a lead to the bottom plate of the capacitor. Thus, capacitor performance is not detrimentally impacted with poly deposition and doping conditions. The flexibility of the process, as well as the robustness is, therefore, much improved.

SUMMARY OF THE INVENTION

In a disclosed embodiment, a method is provided for forming a capacitor structure. The method comprises: forming a doped polysilicon layer on an underlying dielectric layer; forming a dielectric stack on the doped polysilicon layer; forming a contact hole in the dielectric stack to expose a surface region of the doped polysilicon layer; forming a conductive contact plug that fills the contact hole and is in contact with the exposed surface of the doped polysilicon layer; forming a plurality of trenches in the dielectric stack such that each of the plurality of trenches exposes a corresponding surface region of the doped polysilicon layer; forming a conductive bottom capacitor plate on exposed surfaces of the dielectric stack and on exposed surfaces of the doped polysilicon layer; forming a capacitor dielectric layer on the bottom capacitor plate; and forming a conductive top capacitor plate on the capacitor dielectric layer.

The features and advantages of the various aspects of the subject matter disclosed herein will be more fully understood and appreciated upon consideration of the following detailed description and accompanying drawings, which set forth illustrative embodiments in which the concepts of the claimed subject matter are utilized.

DETAILED DESCRIPTION

Figure 1A:
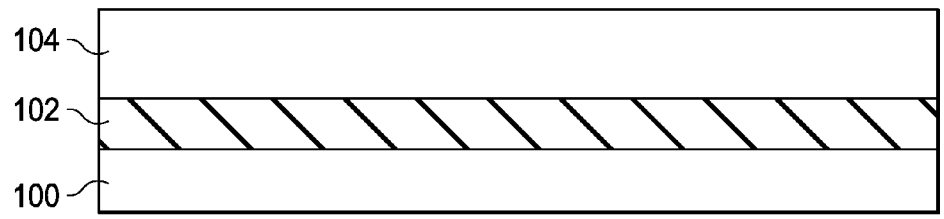
FIGS. 1A-1O are cross section drawings illustrating a sequence of steps in an embodiment of a method of making a modular MIM capacitor structure.

FIG. 1A shows an initial step in a method of making a metal-insulator-metal (MIM) capacitor in accordance with the claimed subject matter. The formation of the disclosed MIM capacitor begins with the deposition and doping of a polysilicon layer 102 (e.g., POCl$_3$ or implanted) on an underlying dielectric layer 100, shown in FIG. 1A as field oxide. Next, a dielectric stack 104 is deposited on the polysilicon layer 102. The dielectric stack may be, for example, silicon oxide, either plasma films such as plasma-enhanced tetra-ethylorthosilicate (PETEOS), high density plasma (HDP) of furnace films such as borophosphosilicate glass (BPSG), or a combination of silicon nitride and silicon oxide films. Planarization of the dielectric stack 104 is performed using, for example, oxide chemical mechanical polishing (CMP).

Figure 1B:
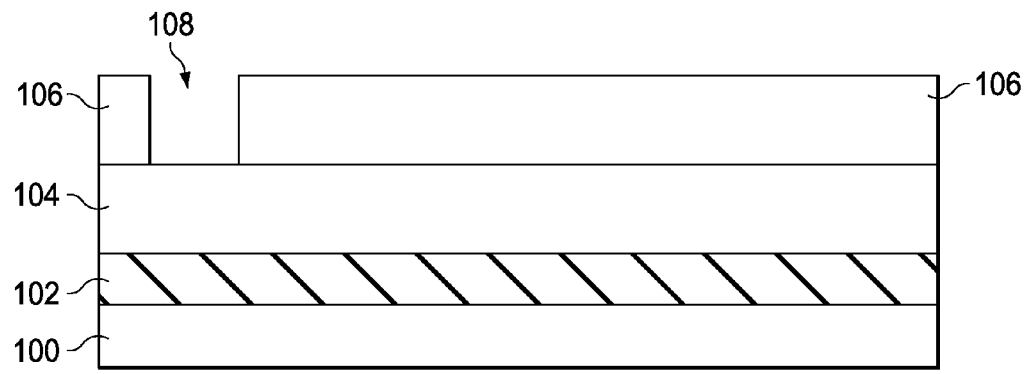

As shown in FIG. 1B, a patterned contact mask 106, such as, for example, photoresist, is then formed on the dielectric stack 104 using well known photolithographic techniques to expose an upper surface region 108 of the dielectric stack 104.

Figure 1C:
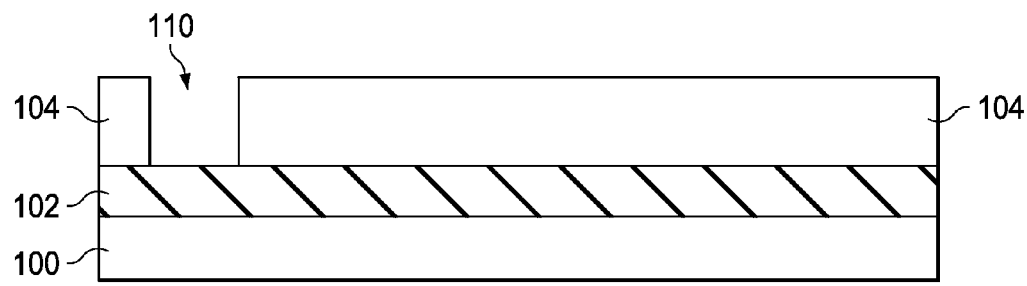

The dielectric stack 104 is then etched to form a contact hole 110 in the dielectric stack 104 for connection to the polysilicon layer 102, which will be a lead that connects to the bottom plate of the capacitor. The contact mask 106 is then stripped using conventional techniques, resulting in the structure shown in FIG. 1C.

Figure 1D:
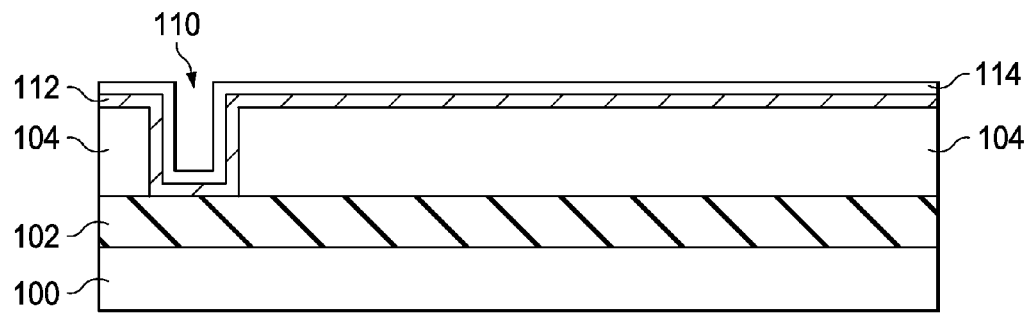

After the contact hole 110 has been defined in the dielectric stack 104, a Ti liner layer 112 and a TiN barrier layer 114 are sequentially deposited, as shown in FIG. 1D. FIG. 1D shows that the Ti liner layer 112 is in contact with the polysilicon layer 102 at the bottom of the contact hole 110.

Figure 1E:
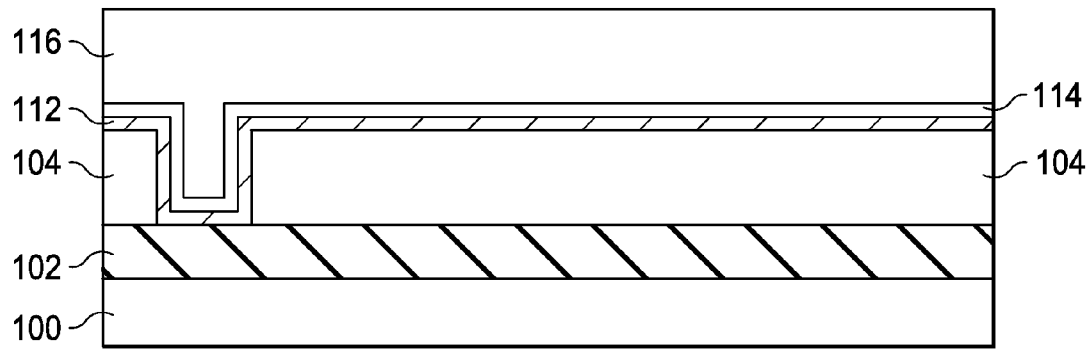
Figure 1F:
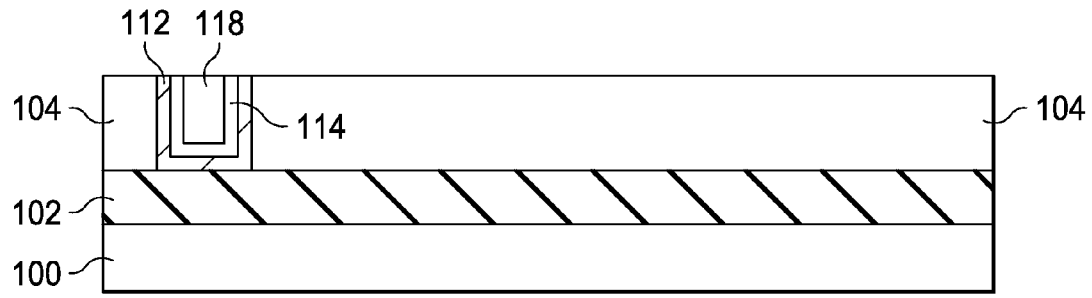

As shown in FIG. 1E, after the contact hole 110 has been defined and the deposition of the Ti liner layer 112 and the TiN barrier layer have been completed, a Tungsten layer 116 is deposited. Next, a Tungsten CMP and a TiN/Ti CMP are performed to remove Tungsten, TiN and Ti from non-contact areas, stopping on the upper surface of the dielectric stack 104 to define a Tungsten plug 118 that fills the contact hole 110, as shown in FIG. 1F.

Figure 1G:
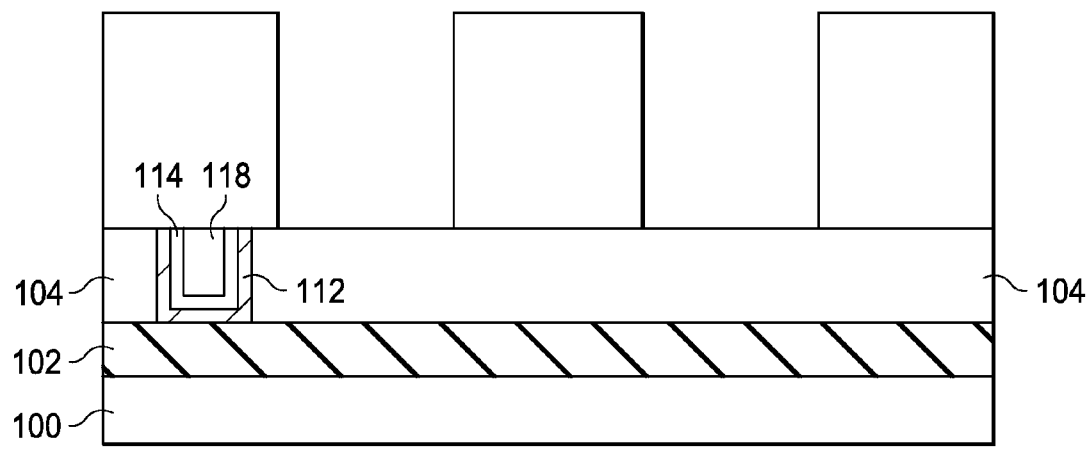
Figure 1H:
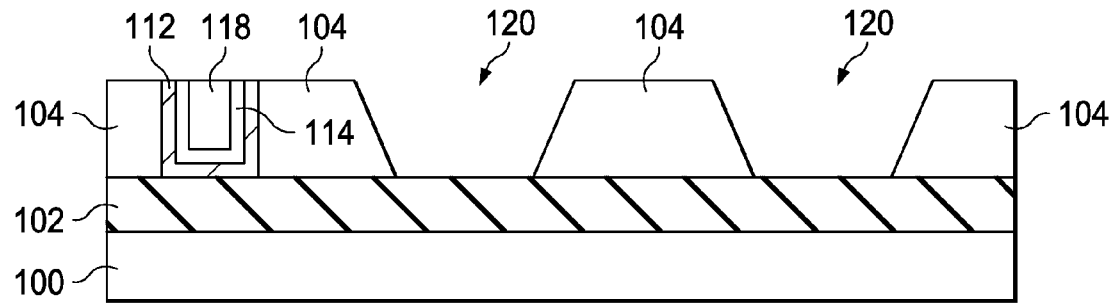

Next, CAP mask (FIG. 1G) and etch steps (FIG. 1H) are performed in the areas where the MIM capacitor is to be formed. The purpose of this CAP mask/etch process is to create a plurality of trenches 120 in the dielectric stack 104, with each trench preferably having substantially vertical sidewalls. A horizontal/vertical MIM can then be formed inside the trenches 120, making efficient use of silicon real estate, and thereby improving density. The pitch of the CAP mask determines the density improvement to be obtained, since more trenches for a given area results in improved density. The lower limit of the CAP pitch is determined by the process trench fill capability.

Figure 1I:
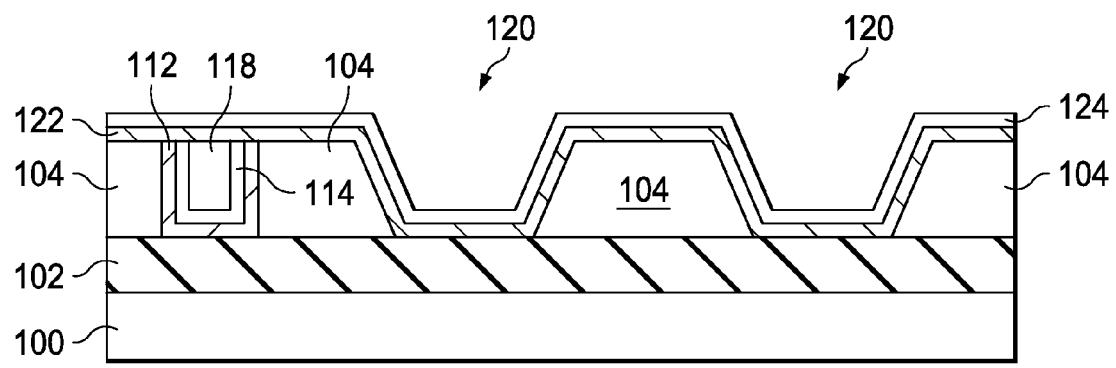

Referring to FIG. 1I, after the CAP mask etch step, a metal slab Ti liner 122 and TiN barrier layer 124 are sequentially deposited. The TiN layer 124 forms the bottom plate of the MIM capacitor.

Figure 1J:
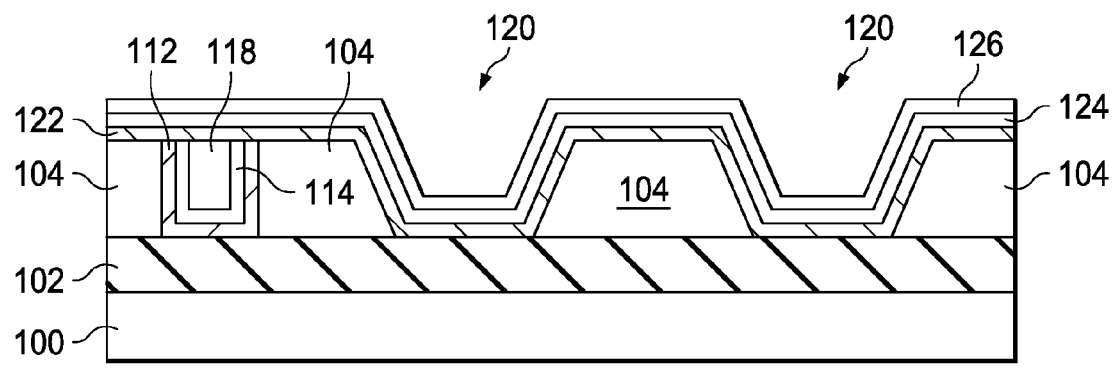
Figure 1K:
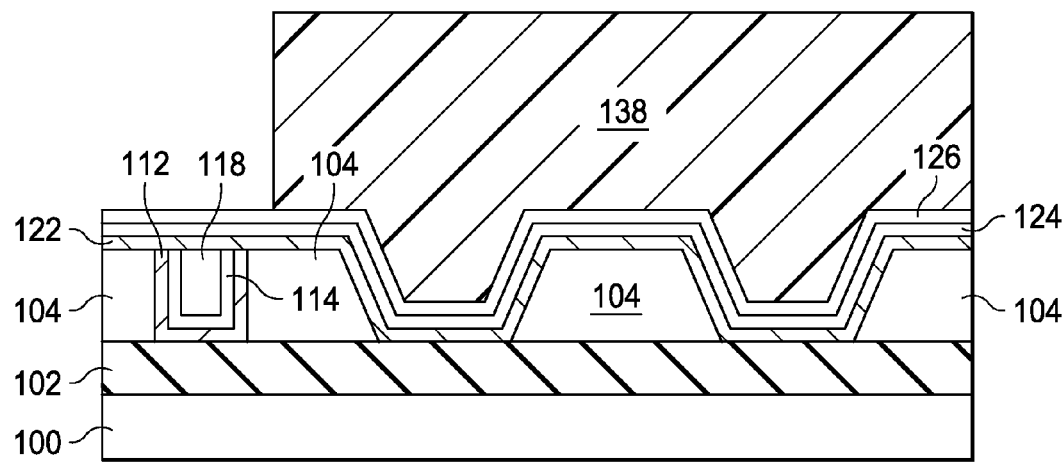
Figure 1L:
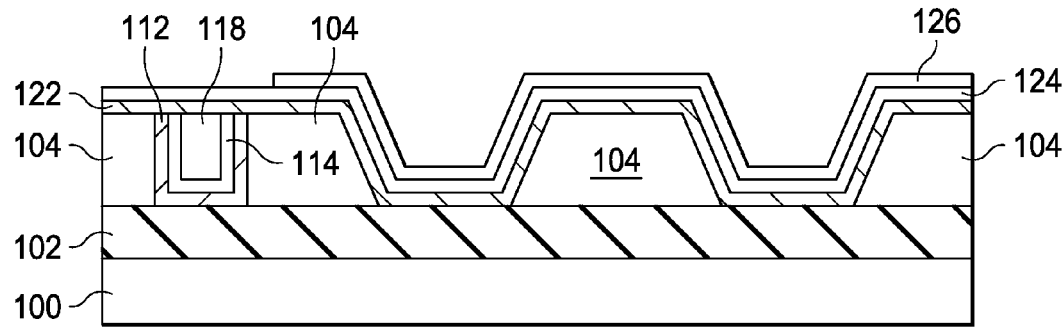

Next, as shown in FIG. 1J, a MIM capacitor dielectric layer 126 (e.g., silicon oxide) is deposited on the TiN barrier layer 124. As shown in FIGS. 1K and 1L respectively, MIM mask 128 and etch steps are done subsequently to remove MIM capacitor dielectric from the non-capacitor areas. The MIM mask 128 is then stripped. A rapid thermal anneal (RTA) step is then performed that serves the purpose of forming silicide at the contacts (A titanium silicide is formed when Ti in the contact reacts with a silicon substrate to form $TiSi_2$ and a polycide film is formed when Ti in the contacts reacts with polysilicon. The reaction of Ti with silicon or polysilicon occurs with the RTA) and densification of the MIM dielectric 126.

Figure 1M:
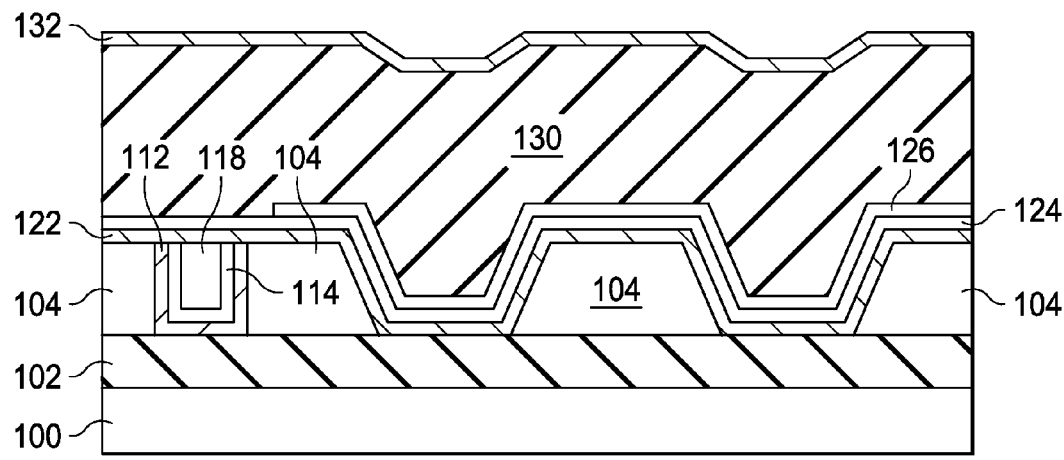

As shown in FIG. 1M, a layer of conductive metal 130, such as for example AlCu (AlCu is preferred for this application due to its simplicity and process cost) is then deposited, forming the top plate of the MIM capacitor. This is followed by deposition of a thin metal layer 132, such as for example TiN (TiN is best for MIM capacitor breakdown consideration and for film stability (acts as a diffusion barrier). Also the metal stack in a standard process flow comprises Ti/TiN/AlCu. In this case, the stack is broken up (i.e., Ti deposition is done, then MIM oxide is deposited and patterned, then TiN deposition is done, instead of Ti/TiN deposition sequentially) to have TiN as the top plate of the MOM capacitor, yet in non-MIM regions, the standard metal stack is maintained.

Figure 1N:
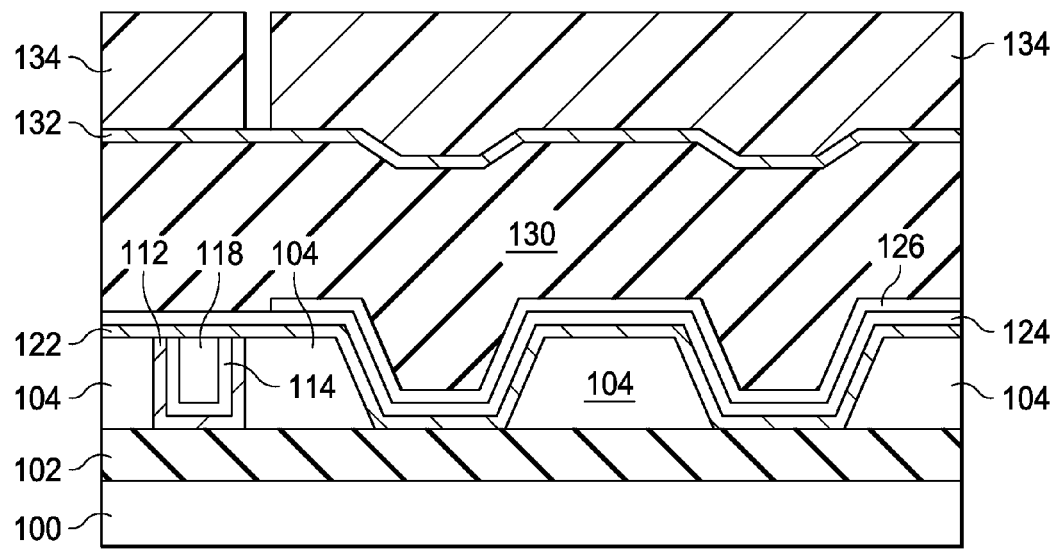
Figure 1O:
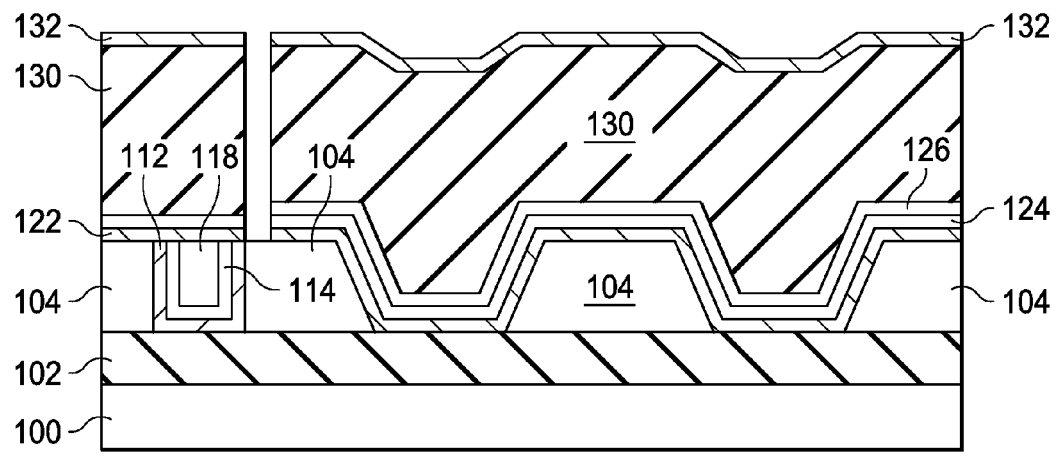

A patterned mask 134 (Metal Mask) 134 is then formed on the thin metal layer 132, as shown in FIG. 1N, and utilized to etch through the thin metal layer 132, the conductive metal layer 130, the TiN layer 124 and the Ti layer, stopping on the dielectric stack (D1 Stack) 104 to define the MIM capacitor structure. The mask 134 is then stripped, resulting in the structure shown in FIG. 1O.

Figure 2:
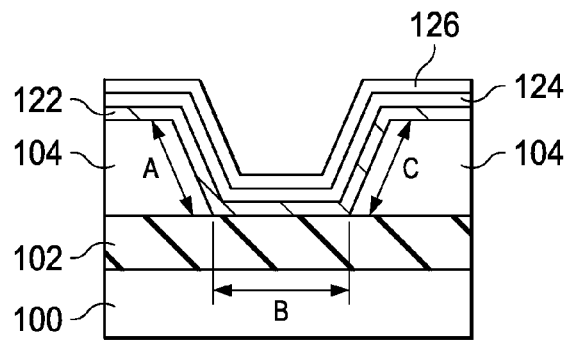
FIG. 2 is a cross section drawing illustrating a capacitor segment in the FIG. 1A-1O embodiment.

A typical metal-poly capacitor in a conventional process would be of dimension 300×150 sq. μm. Assuming a layout rule for the CAP mask in the FIG. 1A-1O embodiment of 3 μm line/3 μm space (6 μm pitch) and a dielectric stack 104 thickness of 0.5 μm above the polysilicon 102, the number of capacitor segments along the 300 μm length is 50 and the number of capacitor segments along the width is 25. Referring to FIG. 2, the increase in length per segment due to the use of the CAP mask is dimension "A"+"C". Dimension "A"="C"~=0.5 μm; that is, the per segment increase in length equals 1 μm. The total length increase with the disclosed layout and process embodiment is 1 μm*50; the total width increase with the disclosed layout and process embodiment is 1 μm*25. The total area with the disclosed layout and process embodiment is (300+50)*(150+25); thus, the area improvement is [(350*175)−(300*150)]/[350*175]=36.11%.

Figure 3:
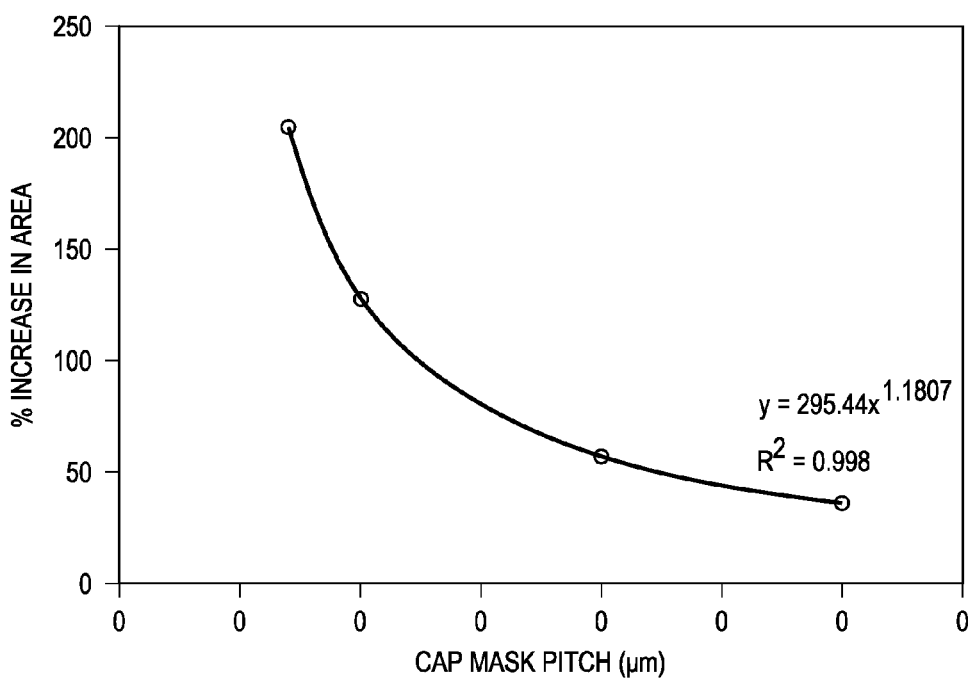
FIG. 3 is a graph showing area improvement in the FIG. 1A-1O embodiment as a function of capacitor mask pitch.

The FIG. 3 graph shows the area (and hence density) improvement in the disclosed MIM capacitor as a function of CAP mask pitch. As shown in FIG. 3, the density improvement can be as high as 200% for a CAP mask pitch of 1.5 μm. Thus, significant improvement in capacitance density can be obtained without changing the capacitor dielectric to a high K material, thereby saving in the cost and complexity of process associated with the use of a high K dielectric material.

The disclosed embodiment makes efficient use of silicon real estate to improve capacitance density, leading to die size reduction.

Conventional processes use a polysilicon bottom plate for the capacitor. Robustness of the capacitor in terms of breakdown distribution has been seen to be significantly impacted by the surface roughness of the poly, which in turn depends on various factors including poly deposition condition (temperature, pressure), poly doping ($POCl_3$ flow, temperature), and subsequent anneal temperature. Complex processing to smooth the poly surface that forms the bottom plate of the capacitor is therefore needed for better breakdown distribution. In the disclosed embodiment, the bottom plate of the capacitor is TiN, which does not pose the problems associated with poly surface roughness.

In conventional processes, the doping process of the polysilicon has a significant impact on surface roughness, which impacts the breakdown distribution of the capacitor significantly. In the disclosed embodiment, polysilicon is only used to connect to the bottom plate of the capacitor. Therefore, the doping method may be either implanted (N+ or P+) or $POCl_3$ doping without any detrimental impact on the performance of the capacitor.

It should be understood that the particular embodiment described herein has been provided by way of example and that other modifications may occur to those skilled in the art without departing from the scope of the claimed subject matter as expressed in the appended claims and their equivalents.

What is claimed is:

1. A method of forming a Metal Insulator Metal (MIM) capacitor structure to improve capacitance density, the method comprising:
   forming a doped polysilicon layer on an underlying dielectric layer;
   forming a dielectric stack of either plasma enhanced tetraethylorthosilicate (PETEOS) or borophosphosilicate glass (BPSG) on the doped polysilicon layer;
   planarizing the dielectric stack using chemical mechanical polishing (CMP);
   forming a contact hole in the dielectric stack to expose a surface region of the doped polysilicon layer;
   sequentially depositing a first Ti liner layer and a first TiN barrier layer, wherein the first Ti liner layer is in contact with the doped polysilicon layer;
   depositing a Tungsten layer over the first TiN barrier layer, wherein the Tungsten layer fills the contact hole;
   planarizing the Tungsten layer, the first TiN barrier and the first Ti liner layers to remove the Tungsten, the first TiN barrier and the first Ti liner layers from non-contact areas, stopping on the upper surface of the dielectric stack to define a Tungsten plug that fills the contact hole;
   forming a plurality of trenches, having a pitch, bottoms and sidewalls, in the dielectric stack such that each of the plurality of trenches exposes a corresponding surface region of the doped polysilicon layer and each trench of the plurality of trenches has substantially vertical sidewalls, wherein the pitch of the trenches determines the density improvement obtained by creation of the trench structure;
   sequentially depositing a second Ti liner layer and a second TiN barrier layer over the exposed surfaces of the dielectric stack and on exposed surfaces of the doped polysilicon layer wherein the second Ti liner layer and the second TiN barrier layer and the underlying doped polysilicon layer form a bottom plate of the MIM capacitor;
   depositing a capacitor dielectric layer on the bottom plate of the MIM capacitor;
   removing the capacitor dielectric layer from non-capacitor areas;
   performing a rapid thermal anneal (RTA) to form a Titanium Silicide at the contacts where the titanium reacts with the doped polysilicon layer to form a $TiSi_2$ film and a polycide film where the Titanium reacts with polysilicon;
   depositing a layer of conductive metal, composed of AlCu to form a conductive top capacitor plate on the capacitor dielectric layer; and
   masking and etching the layer of conductive metal to define the MIM capacitor.

2. The method of claim 1, wherein the dielectric stack comprises silicon oxide.

3. The method of claim 1, wherein the bottom capacitor plate comprises a Ti Liner layer and a TiN barrier layer formed on the Ti liner layer and the underlying doped polysilicon layer.

4. The method of claim 1, wherein the capacitor dielectric layer comprises silicon oxide.

* * * * *